(12) United States Patent
Kamalanathan et al.

(10) Patent No.: US 10,153,430 B1
(45) Date of Patent: Dec. 11, 2018

(54) GERMANIUM-BASED BARRIER MODULATED CELL

(71) Applicant: SANDISK TECHNOLOGIES LLC, Plano, TX (US)

(72) Inventors: Deepak Kamalanathan, San Jose, CA (US); Juan Saenz, Menlo Park, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/621,305

(22) Filed: Jun. 13, 2017

(51) Int. Cl.
    *H01L 29/02*     (2006.01)
    *H01L 45/00*     (2006.01)
    *H01L 27/24*     (2006.01)

(52) U.S. Cl.
    CPC .......... *H01L 45/08* (2013.01); *H01L 27/2481* (2013.01); *H01L 45/146* (2013.01); *H01L 45/1683* (2013.01)

(58) Field of Classification Search
    CPC ............... H01L 27/2481; H01L 45/146; H01L 45/1683
    USPC ....................................................... 257/2, 5
    See application file for complete search history.

(56) References Cited

U.S. PATENT DOCUMENTS

| | | | |
|---|---|---|---|
| 8,304,754 B2 * | 11/2012 | Sekar ................. | G11C 13/0007 257/2 |
| 8,537,594 B2 * | 9/2013 | Wada .................. | G11C 11/5685 365/148 |
| 9,412,745 B1 | 8/2016 | Hung | |
| 2014/0065785 A1 | 3/2014 | Yoon | |
| 2015/0069320 A1 | 3/2015 | Rabkin | |
| 2016/0027950 A1 | 1/2016 | Liu | |

OTHER PUBLICATIONS

Tanaka, et al., "Implementation of VMCO Area Switching Cell to VBL Architecture," U.S. Appl. No. 15/085,813, filed Mar. 30, 2016.
(Continued)

*Primary Examiner* — Tan N Tran
(74) *Attorney, Agent, or Firm* — Vierra Magen Marcus LLP

(57) ABSTRACT

Systems and methods for providing a Barrier Modulated Cell (BMC) structure with reduced shifting in stored memory cell resistance levels over time are described. The BMC structure may comprise a reversible resistance-switching memory element within a memory array comprising a first conductive metal oxide (e.g., titanium oxide) in series with an alternating stack of one or more layers of an amorphous low bandgap material (e.g., germanium) with one or more layers of a second conductive metal oxide (e.g., aluminum oxide). The BMC structure may include a barrier layer comprising a first conductive metal oxide, such as titanium oxide or strontium titanate, in series with a germanium stack that includes a layer of amorphous germanium or amorphous silicon germanium paired with a second conductive metal oxide. The second conductive metal oxide (e.g., aluminum oxide) may be different from the first conductive metal oxide (e.g., titanium oxide).

12 Claims, 16 Drawing Sheets

(56) References Cited

OTHER PUBLICATIONS

Govoreanu, et al., "Vacancy-Modulated Conductive Oxide Resistive RAM (VMCO-RRAM): An Area-Scalable Switching Current, Self-Compliant, Highly Nonlinear and Wide on/Off-Window Resistive Switching Cell", IEEE International Electron Devices Meeting (IEDM), Dec. 9-11, 2013.
Office Action dated Mar. 13, 2017, U.S. Appl. No. 15/269,999.
Response to Office Action dated Mar. 13, 2017, U.S. Appl. No. 15/269,999.
Office Action dated May 8, 2017, U.S. Appl. No. 15/269,999.
Notice of Allowance dated Nov. 27, 2017, U.S. Appl. No. 15/269,999.
Response to Office Action dated Aug. 8, 2017, U.S. Appl. No. 15/269,999.

\* cited by examiner

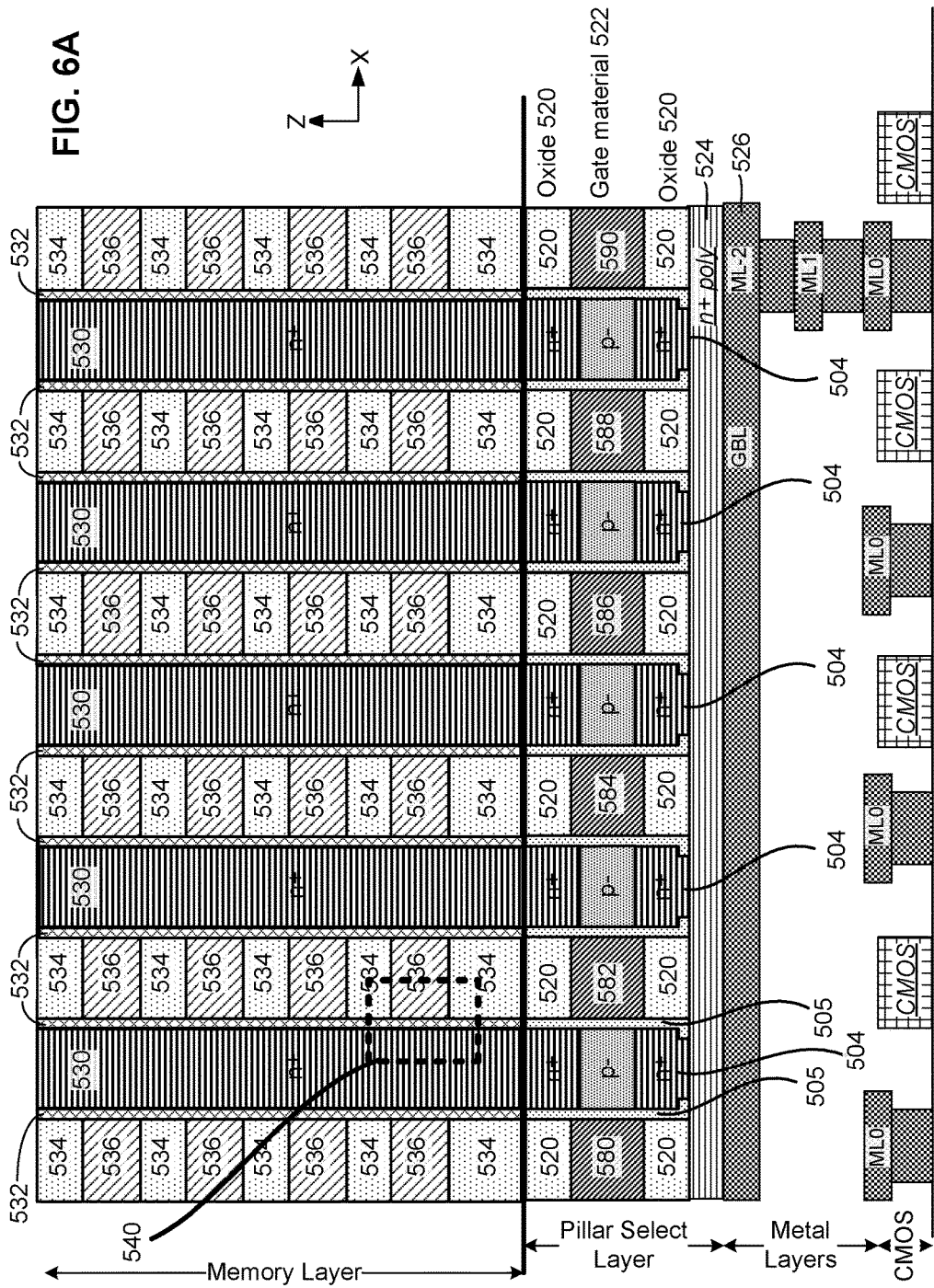

GERMANIUM-BASED BARRIER MODULATED CELL

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell I-V characteristics over process, voltage, and temperature variations and increased leakage currents through unselected memory cells.

BRIEF DESCRIPTION OF THE DRAWINGS

FIG. 6A depicts a cross-sectional view of a memory structure with vertical bit lines.

DETAILED DESCRIPTION

Figure 1A:
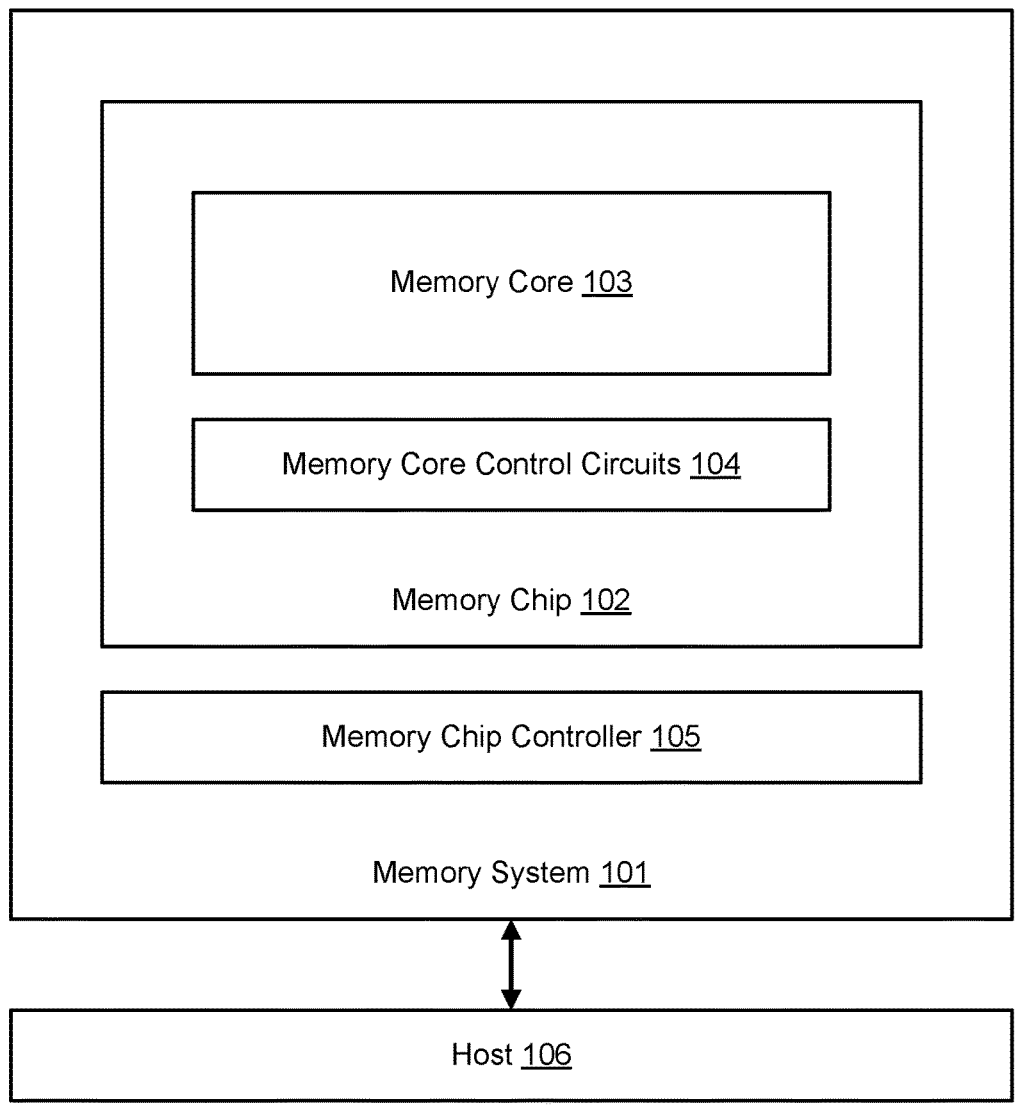
FIGS. 1A-1F depict various embodiments of a memory system.

Technology is described for providing a Barrier Modulated Cell (BMC) structure with reduced shifting in stored memory cell resistance levels over time, thereby increasing data retention and reducing read and write disturb. The BMC structure may comprise a reversible resistance-switching memory element within a memory array comprising a first conductive metal oxide (e.g., titanium oxide) in series with an alternating stack of one or more layers of an amorphous low bandgap material (e.g., germanium) with one or more layers of a second conductive metal oxide (e.g., aluminum oxide). The low bandgap material may comprise a semiconductor material with a bandgap energy (Eg) less than 1.0 eV at room temperature or less than that of silicon, which is close to 1.12 eV at room temperature (e.g., 300K). In some embodiments, the BMC structure may include a barrier layer comprising a first conductive metal oxide, such as titanium oxide (TiO2) or strontium titanate (SrTiO3), in series with a germanium stack that includes a layer of amorphous germanium or amorphous silicon germanium paired with a second conductive metal oxide. The second conductive metal oxide (e.g., aluminum oxide) may be different from the first conductive metal oxide (e.g., titanium oxide). The thickness of the layer of amorphous germanium or amorphous silicon germanium or the distance between the barrier layer and the second conductive metal oxide may be less than a threshold distance (e.g., less than 2 nm). The thickness of the layer of amorphous germanium or amorphous silicon germanium (e.g., 3 nm) may be greater than the thickness of the second conductive metal oxide (e.g., 1 nm).

One benefit of using a BMC structure with a barrier layer comprising a layer of titanium oxide in series with a germanium stack comprising an alternating stack of one or more layers of amorphous germanium or amorphous silicon germanium with one or more layers of aluminum oxide is that the movement of oxygen vacancies or drifting of oxygen from the germanium stack towards the barrier layer after a RESET operation has been performed on the BMC structure may be reduced because aluminum has a greater affinity for oxygen compared with titanium. The reduction in the movement of oxygen vacancies may lead to a reduction in the amount of unintended shifting of a stored high resistance RESET state towards a lower resistance SET state. With improved data retention, the BMC structure may be used for providing multi-level memory elements within a memory array.

In some embodiments, the germanium stack in series with the barrier layer may comprise an alternating stack of one or more layers of amorphous germanium or amorphous silicon germanium with one or more layers of a metal oxide, such as titanium oxide or aluminum oxide. For example, the germanium stack may comprise a first layer of amorphous germanium that is positioned above a first layer of aluminum oxide that is positioned above a second layer of amorphous germanium that is positioned above a second layer of aluminum oxide. The thickness of the first layer of amorphous germanium separating the barrier layer from the first layer of aluminum oxide may be less than 2 nm and may be greater than the thickness of the first layer of aluminum oxide. The first layer of aluminum oxide may have a thickness ranging between 0.3 nm to 1 nm.

In some embodiments, the BMC structure may include a barrier layer comprising a layer of titanium oxide (TiO2) or strontium titanate (SrTiO3) in series with a germanium-metal alloy, such as germanium doped with aluminum, hafnium, or zirconium. The germanium layer may also be uniformly doped with silicon or other semiconducting material. Thus, rather than forming or arranging layers of aluminum oxide or another metal oxide within the germanium stack, the germanium layer itself may be uniformly doped with aluminum, titanium, or another metal.

In some embodiments, the BMC structure may be partially or fully embedded within a word line layer of a memory array, such as a memory array arranged using a Vertical Bit Line (VBL) architecture (e.g., a memory array architecture in which memory cells are arranged between horizontal word lines and vertical bit lines that are orthogonal to a substrate). The BMC structure may be partially or fully formed within a word line layer of a memory array. In some cases, the BMC structure may be partially or fully formed between word line layers within a memory array.

One issue with integrating a BMC structure within a memory array is that the thickness of the layers within the BMC structure required for reliable memory cell switching may limit the ability to scale or shrink the memory array (e.g., the layer of amorphous germanium may have to be at least 5 nm and/or the layer of titanium oxide may have to be at least 5 nm). Partially or fully embedding a BMC structure (or other memory cell switching structure, such as a ReRAM material structure) into a recessed portion of a word line layer may allow for a reduction in die area and may improve the reliability of the memory cell structures (e.g., by providing improved isolation between BMC structures).

In some embodiments, a memory array may comprise a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
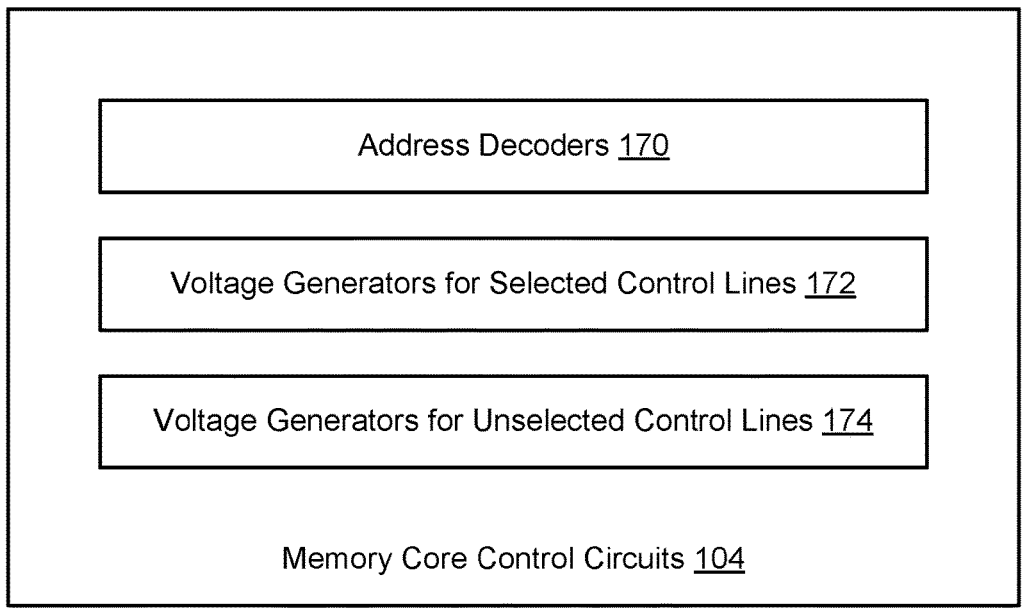

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

Figure 1C:
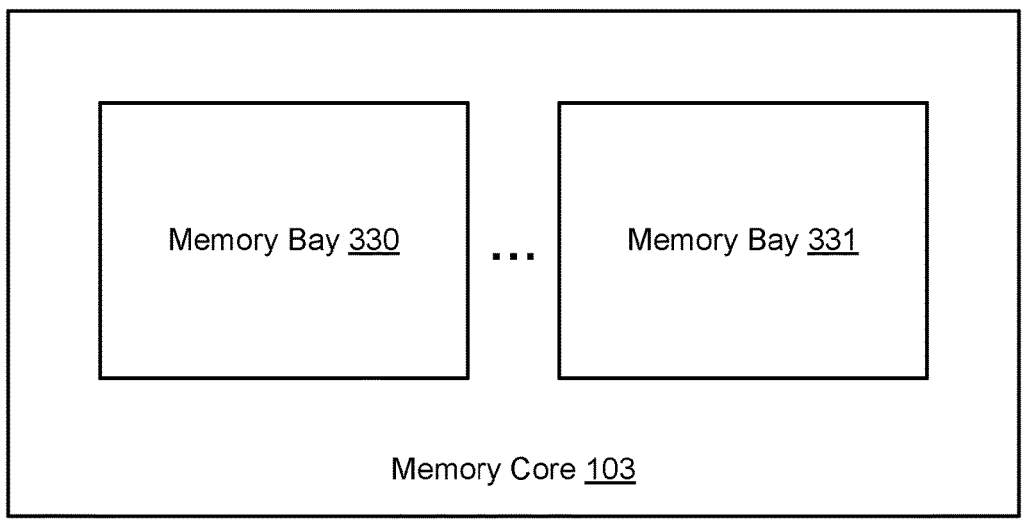

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays or 256 memory bays).

Figure 1D:
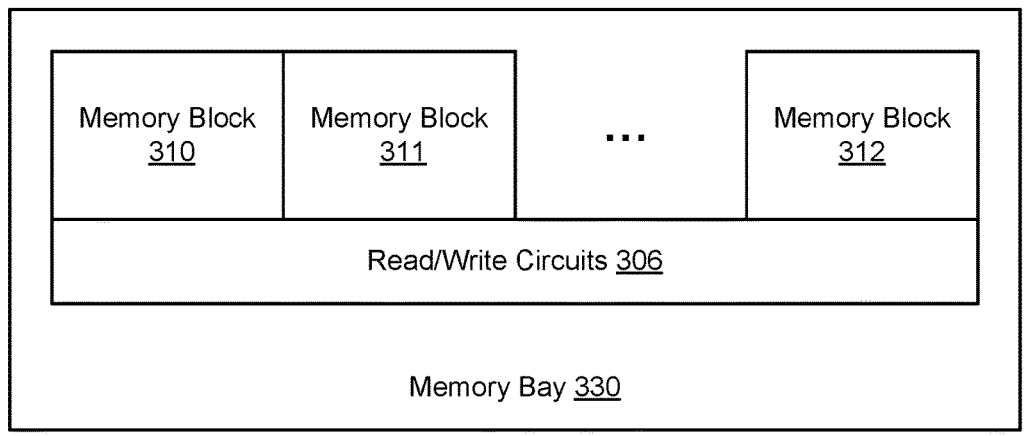

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 306 may be used to program a particular memory cell to be in one of three or more data/resistance states (i.e., the particular memory cell may comprise a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
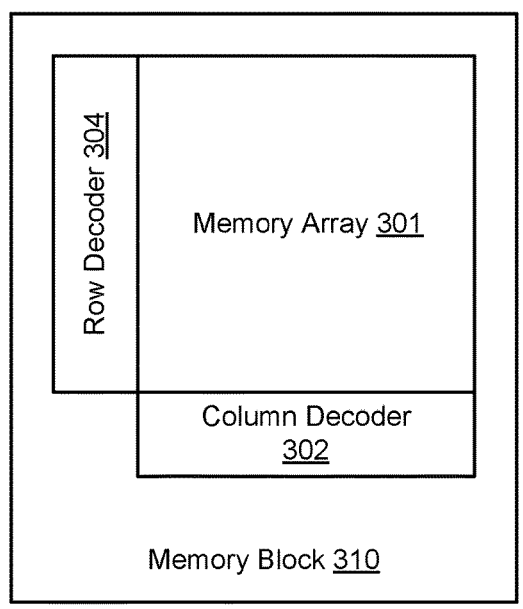

FIG. 1E depicts one embodiment of memory block 310 in FIG. 1D. As depicted, memory block 310 includes a memory array 301, row decoder 304, and column decoder 302. Memory array 301 may comprise a contiguous group of memory cells having contiguous word lines and bit lines. Memory array 301 may comprise one or more layers of memory cells. Memory array 310 may comprise a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
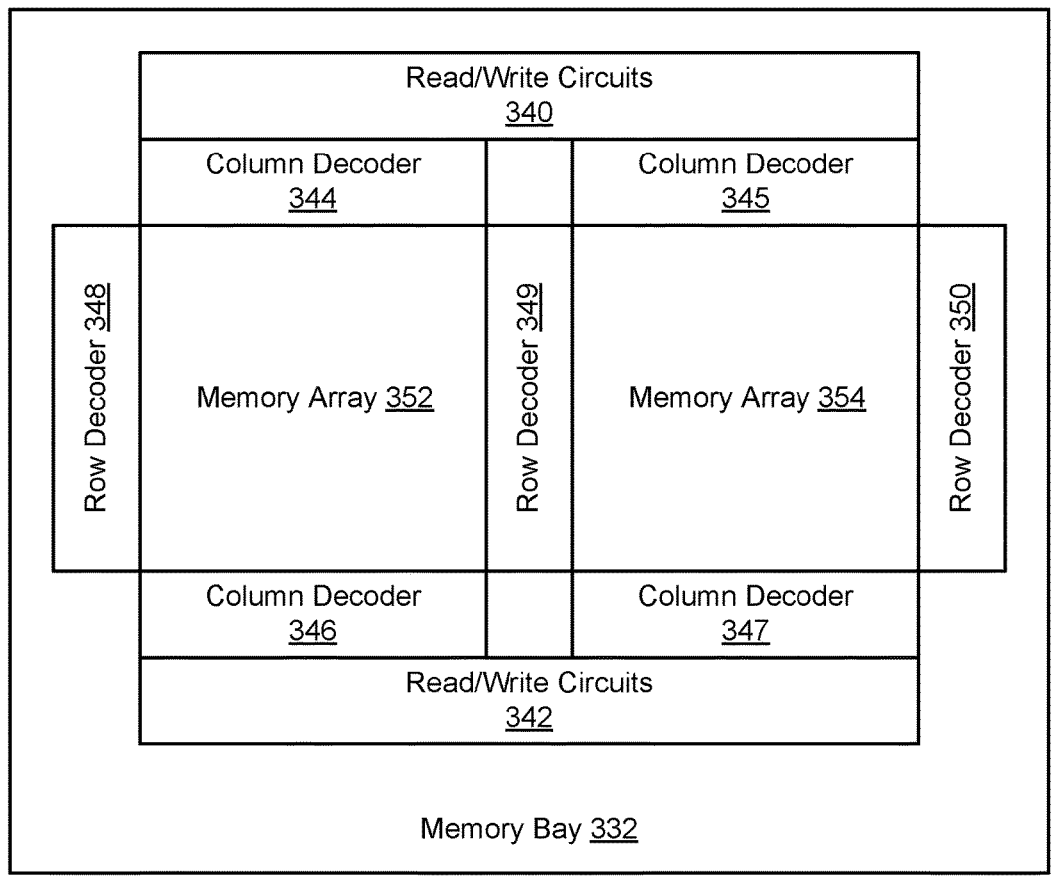

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

In one embodiment, the memory arrays 352 and 354 may comprise memory layers that are oriented in a horizontal plane that is horizontal to the supporting substrate. In another embodiment, the memory arrays 352 and 354 may comprise memory layers that are oriented in a vertical plane that is vertical with respect to the supporting substrate (i.e., the vertical plane is perpendicular to the supporting substrate). In this case, the bit lines of the memory arrays may comprise vertical bit lines.

Figure 2:
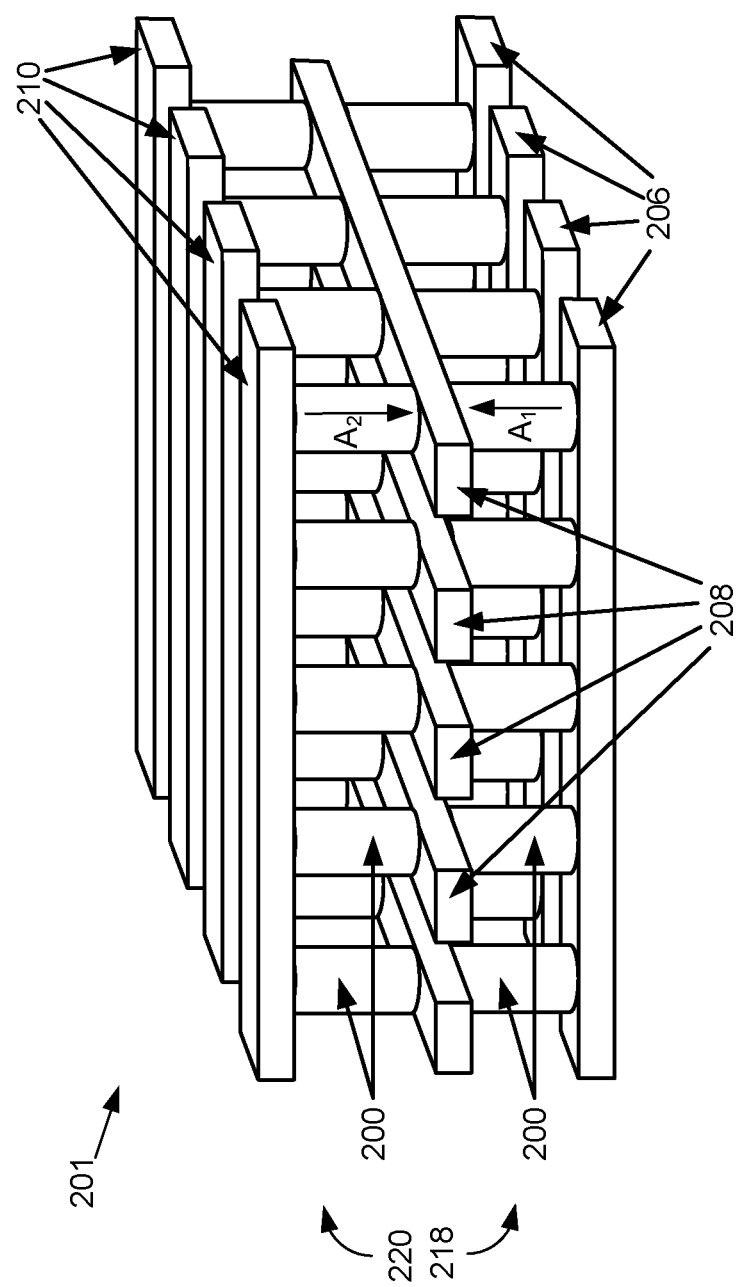
FIGS. 2-3 depict various embodiments of a portion of a three-dimensional memory array.

FIG. 2 depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 2, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes a state change element and does not include a steering element. The absence of a diode (or other steering element) from a memory cell may reduce the process complexity and costs associated with manufacturing a memory array.

In one embodiment, the memory cells 200 of FIG. 2 may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a barrier layer comprising germanium or silicon germanium and a metal oxide (e.g., a binary metal oxide). The metal oxide may include titanium oxide, nickel oxide, or hafnium oxide. In some cases, the re-writeable non-volatile memory cells may comprise resistive RAM (ReRAM) devices.

Referring to FIG. 2, in one embodiment of a read operation, the data stored in one of the plurality of memory cells 200 may be read by biasing one of the word lines (i.e., the selected word line) to a selected word line voltage in read mode (e.g., 0V). A read circuit may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a read circuit may then sense an auto zero amount of current through the selected memory bit line which is subtracted from the bit line current in a second current sensing when the selected word line voltage is applied to the selected word line.

Referring to FIG. 2, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to comprise more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding may be reversed. For example, the high-resistivity state may be associated with binary data "0" and the low-resistivity state may be associated with binary data "1." In some embodiments, a higher than normal programming voltage may be required the first time a reversible resistance-switching element is SET into the low-resistivity state as the reversible resistance-switching element may have been placed into a resistance state that is higher than the high-resistivity state when fabricated. The term "FORMING" may refer to the setting of a reversible resistance-switching element into a low-resistivity state for the first time after fabrication or the resetting of a reversible resistance-switching element into a high-resistivity state for the first time after fabrication. In some cases, after a FORMING operation or a memory cell preconditioning operation has been performed, the reversible resistance-switching element may be RESET to the high-resistivity state and then SET again to the low-resistivity state.

Referring to FIG. 2, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3:
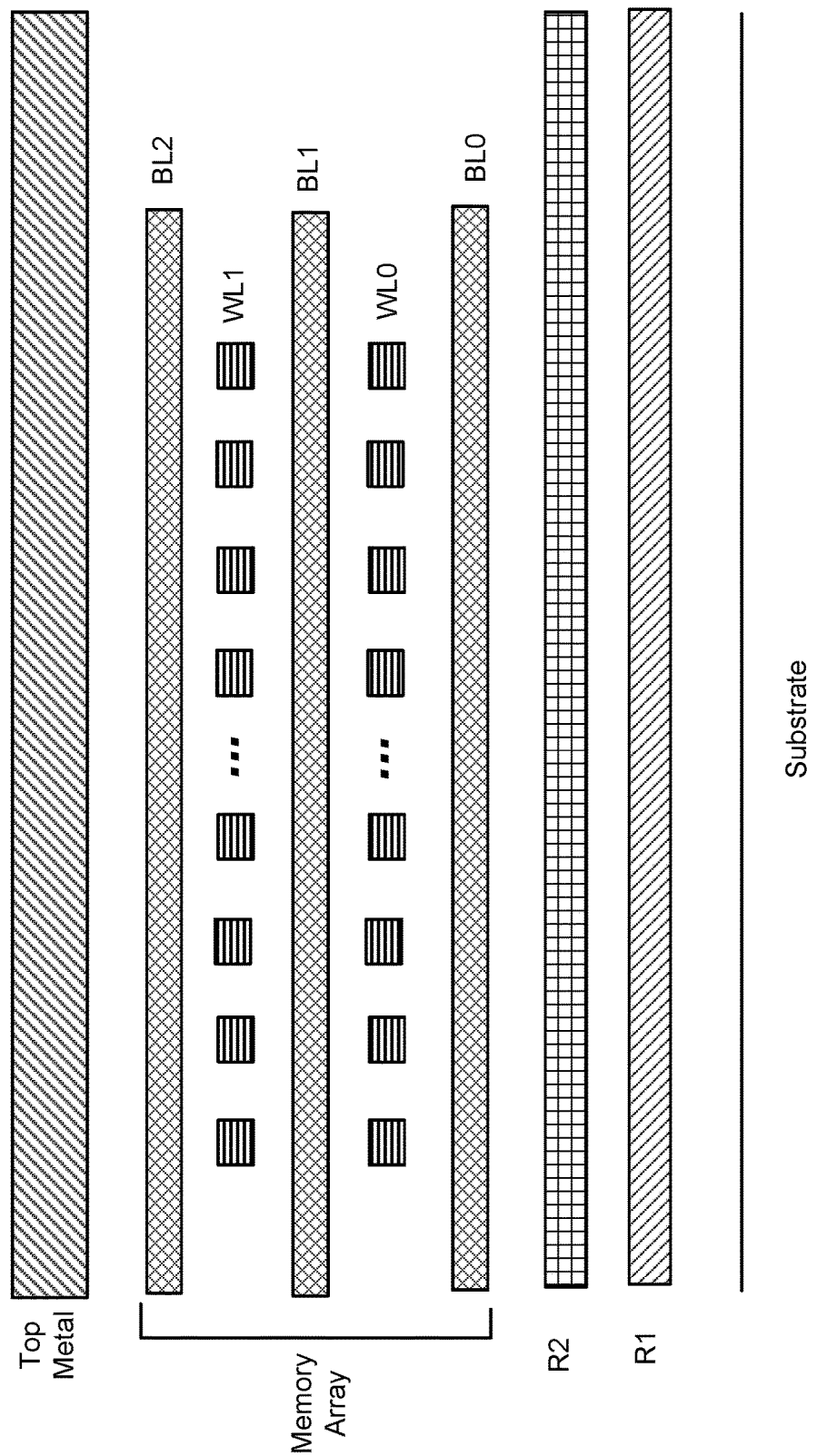

FIG. 3 depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3, two metal layers R1 and R2 may be used for routing layers; however, other embodiments can include more or less than two metal layers. In one example, these metal layers R1 and R2 may be formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 4A:
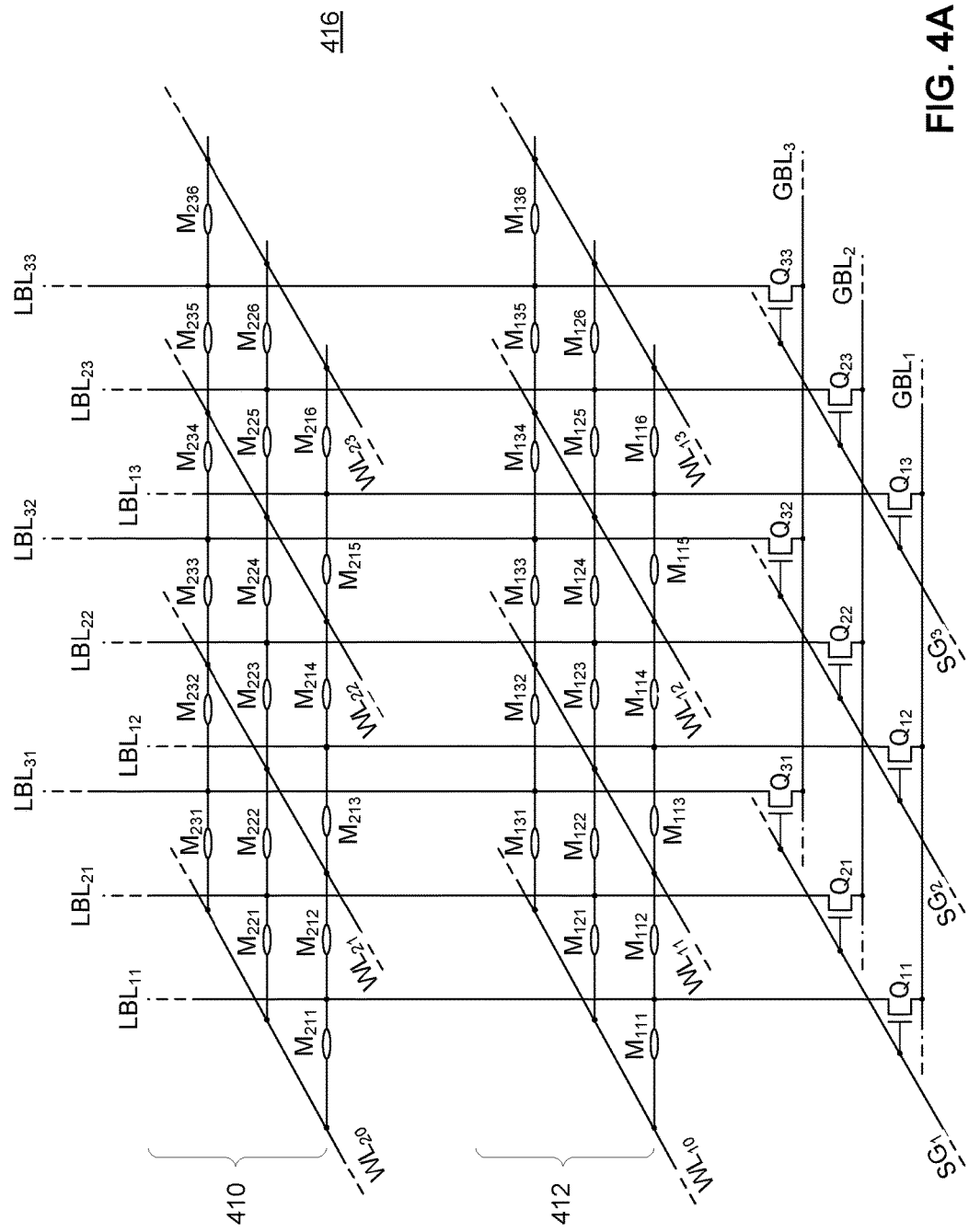
FIGS. 4A-4B depict various embodiments of a portion of a three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

Figure 4B:
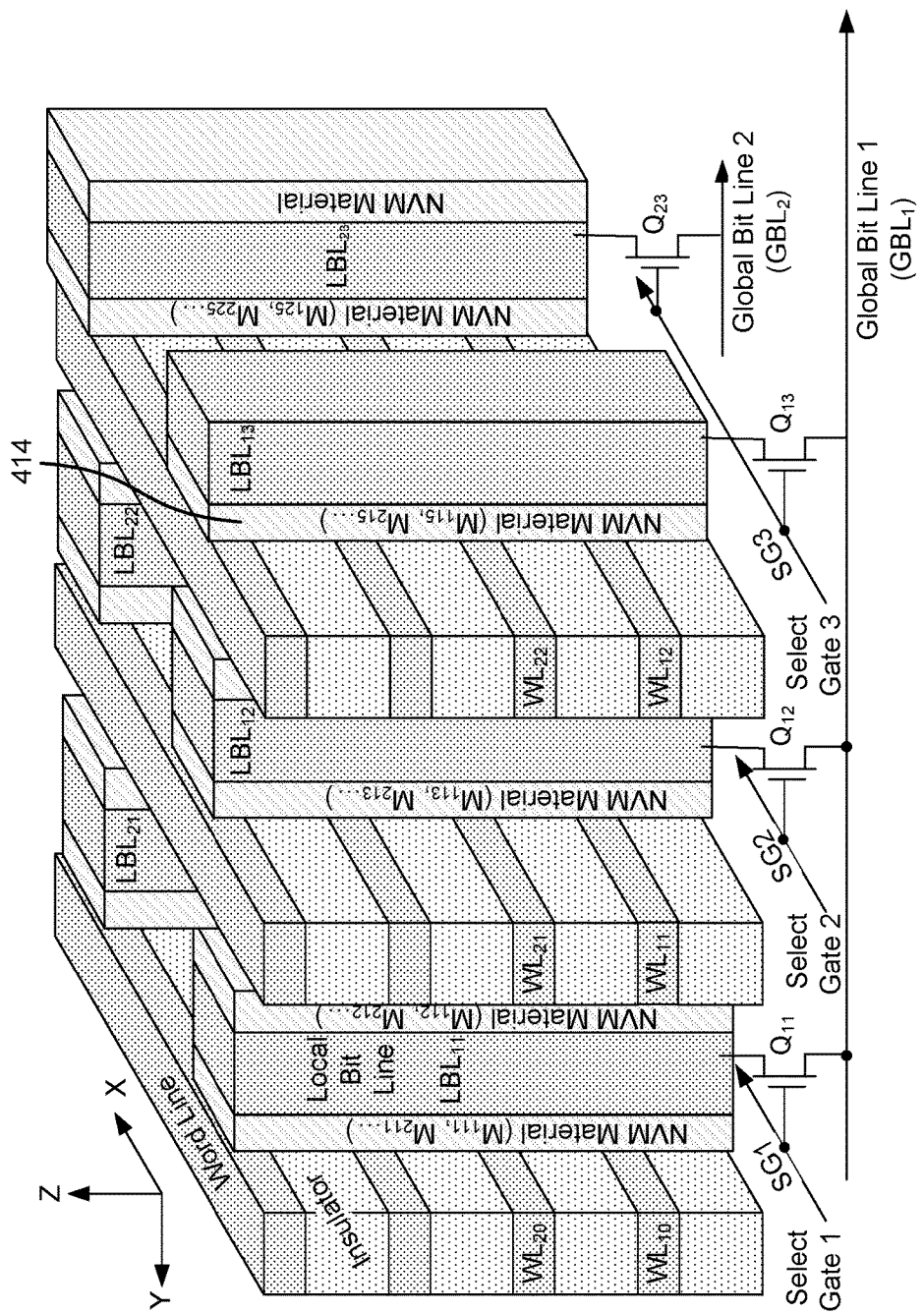

FIG. 4B depicts one embodiment of a portion of a monolithic three-dimensional memory array that includes vertical strips of a non-volatile memory material. The physical structure depicted in FIG. 4B may comprise one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., titanium oxide, nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 414 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT).

Figure 5:
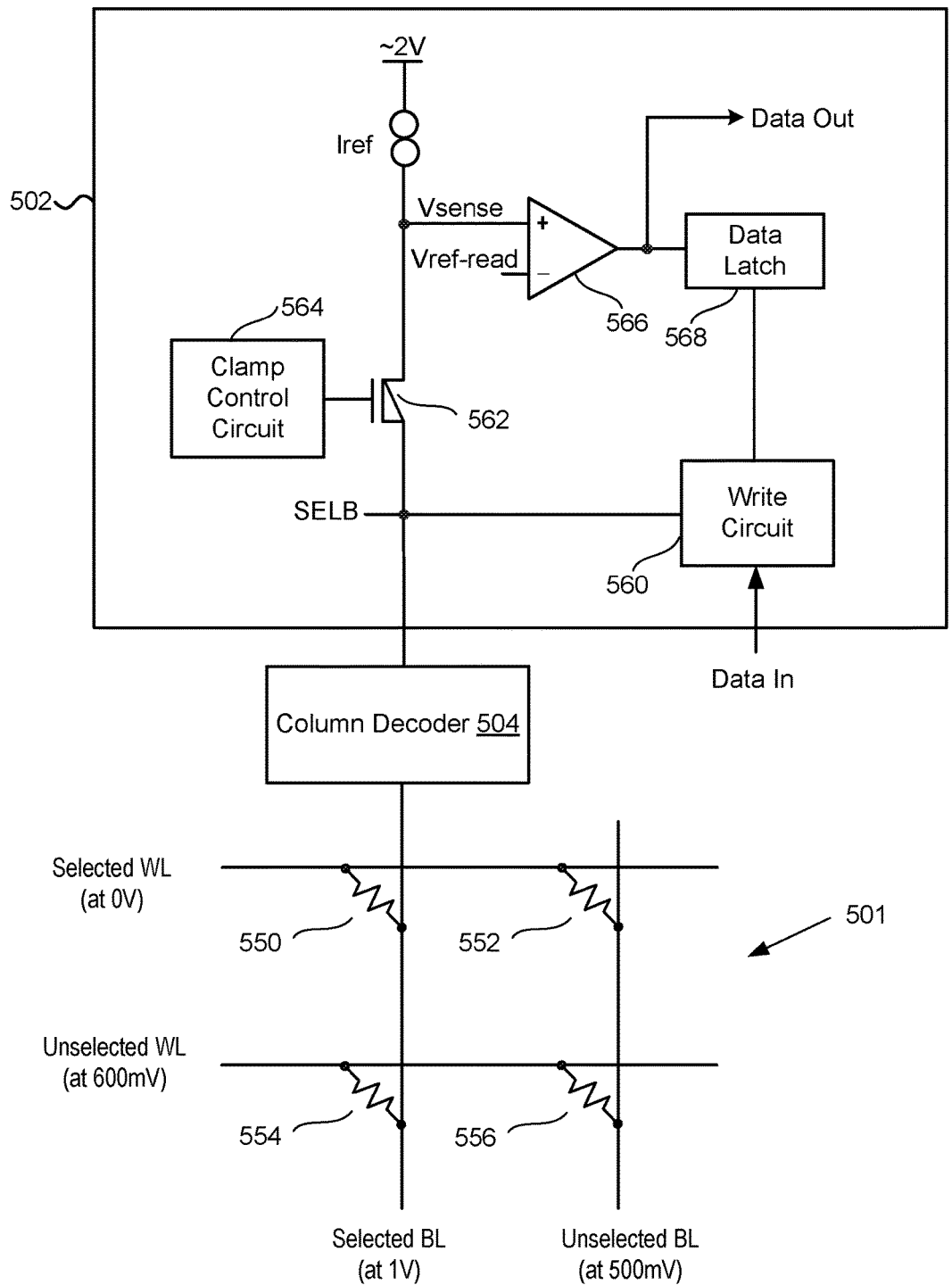
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2. In another embodiment, the portion of a memory array 501 may comprise a memory array with bit lines arranged in a vertical direction that is perpendicular to the substrate, such as memory array 416 in FIG. 4A.

The memory array 501 may include a memory cell with a BMC structure. In one embodiment, the BMC structure may include a barrier layer comprising a layer of titanium oxide or strontium titanate in series with a germanium-metal alloy, such as germanium doped with aluminum, hafnium, or zirconium. In another embodiment, the BMC structure may include a germanium stack in series with a barrier layer that comprises an alternating stack of one or more layers of amorphous germanium or amorphous silicon germanium with one or more layers of a metal oxide, such as titanium oxide or aluminum oxide.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

FIG. 6A depicts a cross-sectional view of a memory structure using the vertically oriented select devices shown in FIG. 4B. The memory structure of FIG. 6A may comprise a continuous mesh array of memory elements because there are memory elements connected to both sides of the bit lines and memory elements connected to both sides of the word lines. At the bottom of FIG. 6A, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched there between. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ poly-silicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, . . . of FIG. 4B), which are labeled in FIG. 6A as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 534 and word line layers 536 are vertically oriented layers of reversible resistance switching material 532. In one embodiment, the reversible resistance switching material 532 may include a layer of amorphous germanium or a layer of amorphous silicon germanium (e.g., a Ge or SiGe barrier layer) and a layer of titanium oxide (e.g., a TiO2 switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 6A also shows an n+ polysilicon layer 524. As depicted, the npn TFT of vertically oriented select devices 504 can be used to connect the global bit line GBL (layer 526) with any of the vertical bit lines 530.

Moreover, FIG. 6A shows six row select lines ($SG_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region. This allows the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (ME). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

Figure 6B:
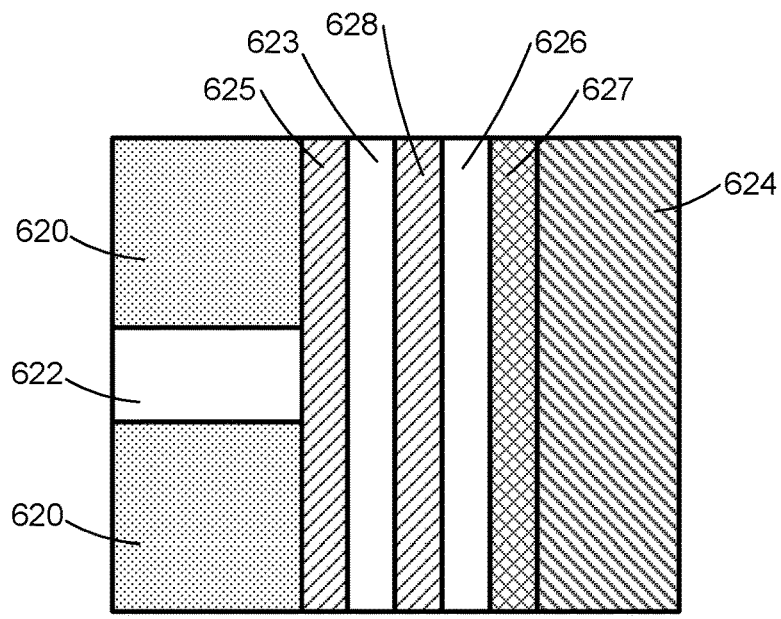
FIGS. 6B-6E depict various embodiments of a BMC structure that includes a layer of germanium or silicon germanium in series with two or more conductive metal oxides.

FIG. 6B depicts one embodiment of a BMC structure that includes a layer of germanium or silicon germanium in series with two or more conductive metal oxides. In one example, the BMC structure may correspond with a memory element sandwiched between a word line and a vertical bit line that may be formed within box 540 in FIG. 6A. As depicted, a bit line 624 (e.g., a vertical bit line comprising tungsten) is arranged adjacent to a titanium nitride layer 627 that is arranged adjacent to a first conductive metal oxide layer 626 (e.g., a layer of titanium oxide) that is arranged adjacent to a first layer of amorphous germanium or amorphous silicon germanium 628 that is arranged adjacent to a second conductive metal oxide layer 623 (e.g., a layer of aluminum oxide) different from the first conductive metal oxide layer 626 that is arranged adjacent to a second layer of amorphous germanium or amorphous silicon germanium 625. In some cases, the thickness of the first layer of amorphous germanium or amorphous silicon germanium 628 may range between 0.5 nm and 10 nm. In some cases, the thickness of the first conductive metal oxide layer 626 may range between 2 nm and 10 nm and the thickness of the second conductive metal oxide layer 623 may range between 0.3 nm and 1.5 nm or a value less than the thickness of the first conductive metal oxide layer 626. A word line 622 may directly connect to the second layer of amorphous germanium or amorphous silicon germanium 625 and oxide layers 620 may electrically separate or isolate word lines within a memory array.

Figure 6C:
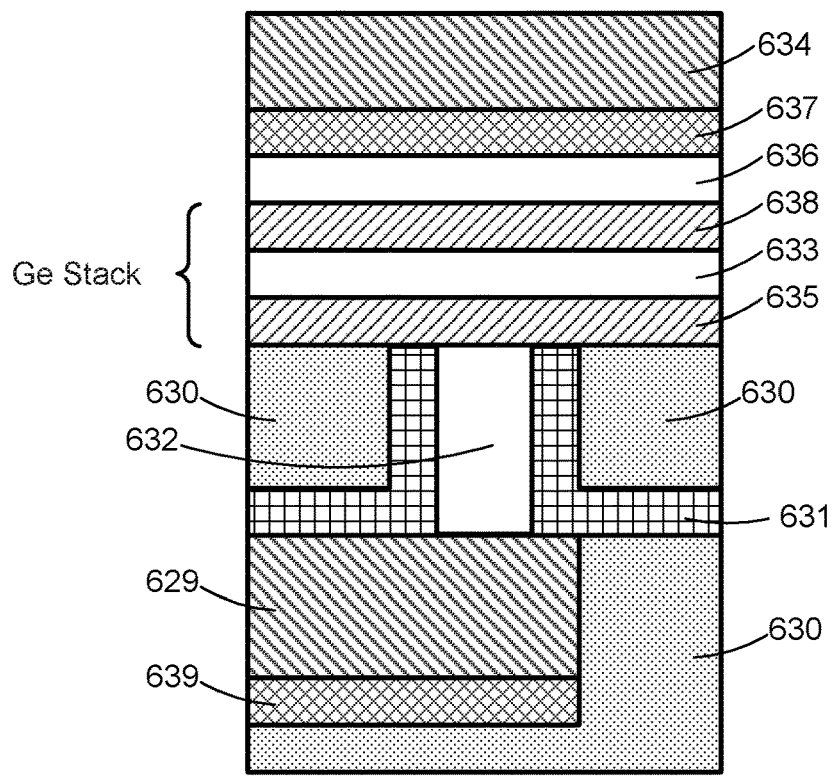

FIG. 6C depicts another embodiment of a BMC structure that includes a layer of germanium or a layer of silicon germanium in series with two or more conductive metal oxides. As depicted, a bit line 634 (e.g., a tungsten bit line) is arranged adjacent to a titanium nitride layer 637 that is arranged adjacent to a first conductive metal oxide layer 636 (e.g., a layer of titanium oxide) that is arranged adjacent to a first layer of amorphous germanium or amorphous silicon germanium 638 that is arranged adjacent to a second conductive metal oxide layer 633 (e.g., a layer of aluminum oxide) different from the first conductive metal oxide layer 636 that is arranged adjacent to a second layer of amorphous germanium or amorphous silicon germanium 635. The word line 629 (e.g., a tungsten word line) connects to the second layer of amorphous germanium or amorphous silicon germanium 635 via the titanium nitride layer 632. A liner spacer 631 may be used to isolate the titanium nitride layer 632 from the oxide layers 630. A layer of titanium nitride 639 may be arranged between the word line 629 and oxide layer 630 (e.g., a layer of silicon dioxide). The first layer of amorphous germanium or amorphous silicon germanium 638, the second conductive metal oxide layer 633, and the second layer of amorphous germanium or amorphous silicon germanium 635 may comprise a germanium stack in series with a barrier layer comprising the first conductive metal oxide layer 636. The germanium stack and the barrier layer may comprise a BMC structure corresponding with a memory cell.

Figure 6D:
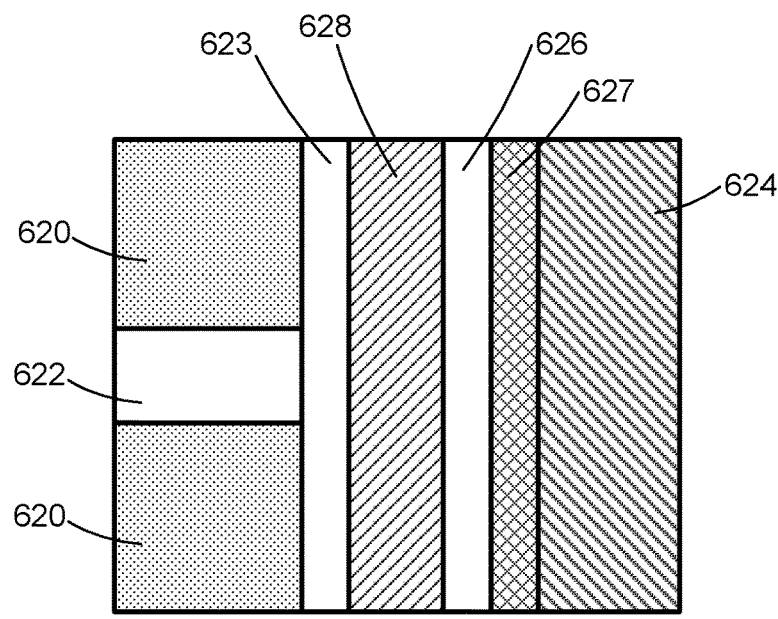

FIG. 6D depicts another embodiment of a BMC structure that includes a layer of germanium or silicon germanium in series with two or more conductive metal oxides. In one example, the BMC structure may correspond with a memory element sandwiched between a word line and a vertical bit line that may be formed within box 540 in FIG. 6A. As depicted, a bit line 624 (e.g., a vertical bit line comprising tungsten) is arranged adjacent to a titanium nitride layer 627 that is arranged adjacent to a first conductive metal oxide layer 626 (e.g., a layer of titanium oxide) that is arranged adjacent to a first layer of amorphous germanium or amorphous silicon germanium 628 that is arranged adjacent to a second conductive metal oxide layer 623 (e.g., a layer of aluminum oxide) different from the first conductive metal oxide layer 626. In some embodiments, the metal used in the second conductive metal oxide layer 623 may have a greater affinity for oxygen compared with the metal used in the first conductive metal oxide layer 626. In some cases, the thickness of the first layer of amorphous germanium or amorphous silicon germanium 628 may range between 0.5 nm and 10 nm and be greater than the thickness of the second conductive metal oxide layer 623 that may range between 0.3 nm and 1.5 nm. The word line 622 may directly connect to the second conductive metal oxide layer 623 and oxide layers 620 may electrically separate or isolate word lines within a memory array.

Figure 6E:
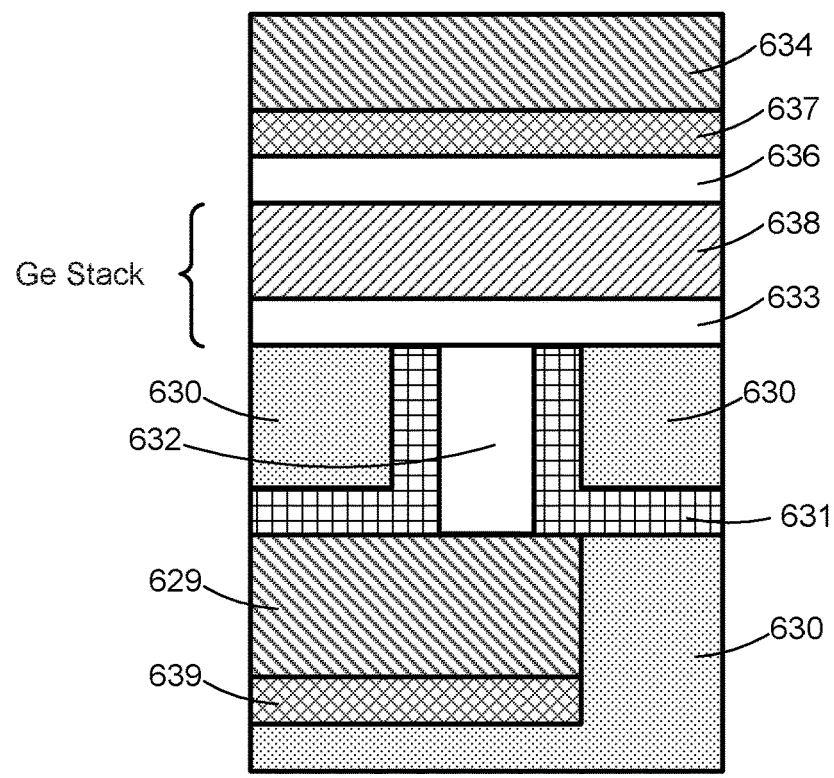

FIG. 6E depicts another embodiment of a BMC structure that includes a layer of germanium or a layer of silicon germanium in series with two or more conductive metal oxides. As depicted, a bit line 634 (e.g., a tungsten bit line) is arranged adjacent to a titanium nitride layer 637 that is arranged adjacent to a first conductive metal oxide layer 636 (e.g., a layer of titanium oxide) that is arranged adjacent to a first layer of amorphous germanium or amorphous silicon germanium 638 that is arranged adjacent to a second conductive metal oxide layer 633 (e.g., a layer of aluminum oxide) different from the first conductive metal oxide layer 636. The word line 629 (e.g., a tungsten word line) connects to the second conductive metal oxide layer 633 via the titanium nitride layer 632. In some embodiments, the metal used in the second conductive metal oxide layer 633 may have a greater affinity for oxygen compared with the metal used in the first conductive metal oxide layer 636. A liner spacer 631 may be used to isolate the titanium nitride layer 632 from the oxide layers 630. A layer of titanium nitride 639 may be arranged between the word line 629 and oxide layer 630 (e.g., a layer of silicon dioxide). The first layer of amorphous germanium or amorphous silicon germanium 638 and the second conductive metal oxide layer 633 may comprise a germanium stack in series with a barrier layer comprising the first conductive metal oxide layer 636. The germanium stack and the barrier layer may comprise a BMC structure corresponding with a rewriteable memory cell.

Figure 6F:
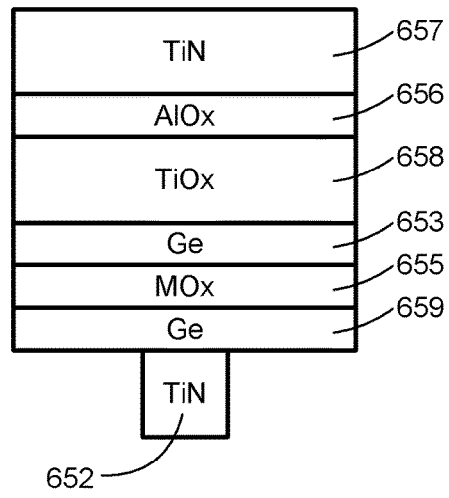
FIGS. 6F-6K depict various reversible resistance-switching BMC structures.
Figure 6G:
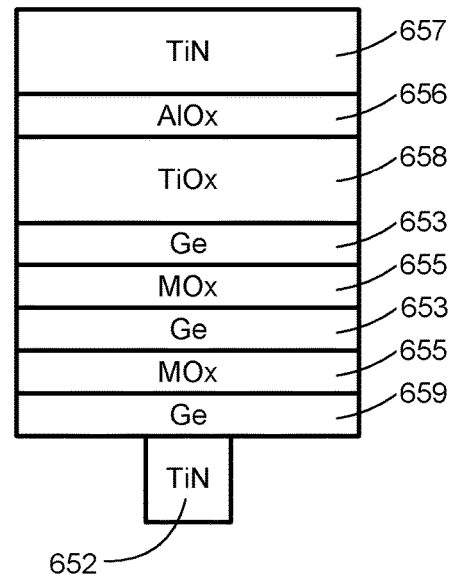

FIGS. 6F-6K depict various reversible resistance-switching BMC structures. FIG. 6F depicts one embodiment of a BMC structure that includes a layer of titanium nitride 657 arranged above or adjacent to a layer of aluminum oxide 656 that is adjacent to the layer of titanium oxide 658 that is adjacent to a germanium layer 653 that is adjacent to a layer of a conductive metal oxide 655 that is adjacent to a second layer of germanium 659 that is in contact with a titanium nitride plug 652. In some cases, the titanium nitride plug 652 may correspond with the titanium nitride layer 632 in FIGS. 6C and 6E. FIG. 6G is a similar configuration to FIG. 6F and includes an additional pair of germanium layer 653 and layer of conductive metal oxide 655 between the layer of titanium oxide 658 (e.g., acting as a barrier layer for the BMC structure) and the second layer of germanium 659. In some cases, a germanium stack may comprise one or more pairs of germanium layers and conductive metal oxide layers.

Figure 6H:
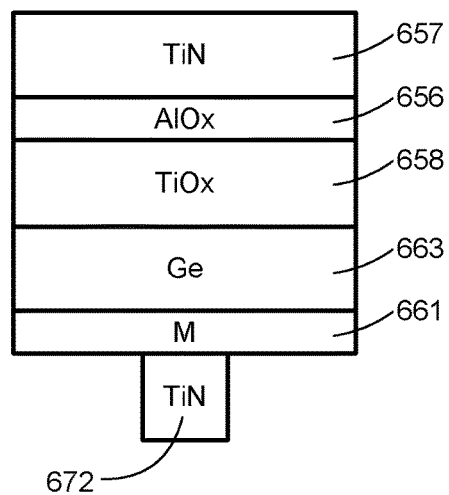

FIG. 6H depicts one embodiment of a BMC structure that includes a layer of titanium nitride 657 arranged above or adjacent to a layer of aluminum oxide 656 that is adjacent to the layer of titanium oxide 658 that is adjacent to a germanium layer 663 that is adjacent to a layer of a metal 661 that is in contact with a titanium nitride plug 672. The layer of metal 661 may comprise a layer of a conducting metal, such as a layer of aluminum, titanium, or tungsten. The thickness of the layer of metal 661 may range between 0.5 nm and 3 nm. The thickness of the germanium layer 663 may be greater than the thickness of the layer of metal 661.

Figure 6I:
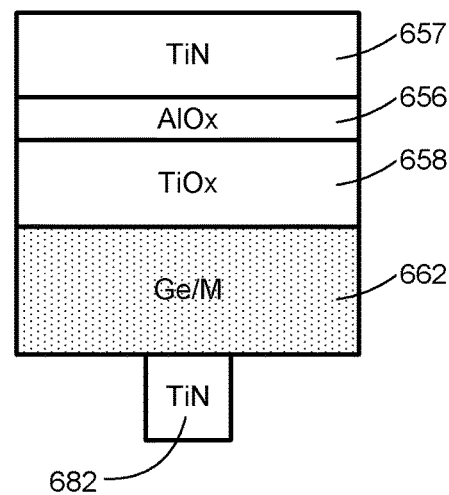

FIG. 6I depicts one embodiment of a BMC structure that includes a layer of titanium nitride 657 arranged above or adjacent to a layer of aluminum oxide 656 that is adjacent to the layer of titanium oxide 658 that is adjacent to a germanium-metal alloy 662 that is in contact with a titanium nitride plug 682. The germanium-metal alloy 662 may comprise a germanium-metal alloy in which the metal comprises one of aluminum, hafnium, tungsten, or zirconium. The germanium-metal alloy 662 may be formed by uniformly doping germanium with the appropriate metal during deposition of the germanium-metal alloy.

Figure 6J:
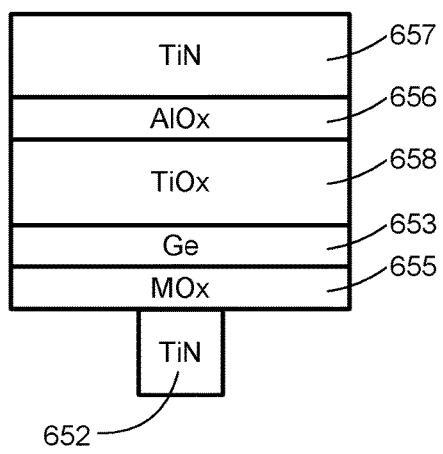
Figure 6K:
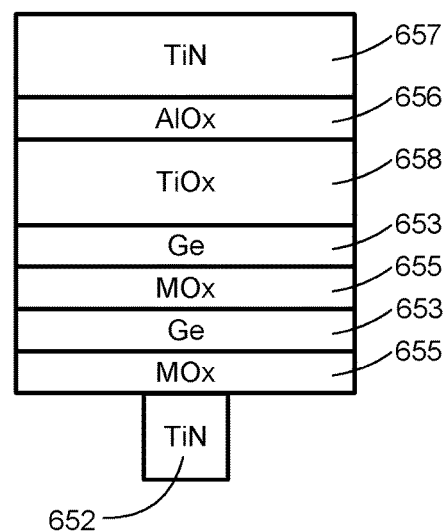

FIG. 6J depicts an alternative embodiment of a BMC structure that includes a layer of titanium nitride 657 arranged above or adjacent to a layer of aluminum oxide 656 that is adjacent to the layer of titanium oxide 658 that is adjacent to a germanium layer 653 that is adjacent to a layer of a conductive metal oxide 655 (e.g., aluminum oxide) that is in contact with a titanium nitride plug 652. In some cases, the titanium nitride plug 652 may correspond with the titanium nitride layer 632 in FIGS. 6C and 6E. FIG. 6K is a similar configuration to FIG. 6J and includes an additional pair of germanium layer 653 and layer of conductive metal oxide 655 between the layer of titanium oxide 658 (e.g., acting as a barrier layer for the BMC structure) and the titanium nitride plug 652. In some cases, a germanium stack may comprise two or more pairs of germanium layers and conductive metal oxide layers positioned between the barrier layer of the BMC structure and the titanium nitride plug 652.

Figure 8:
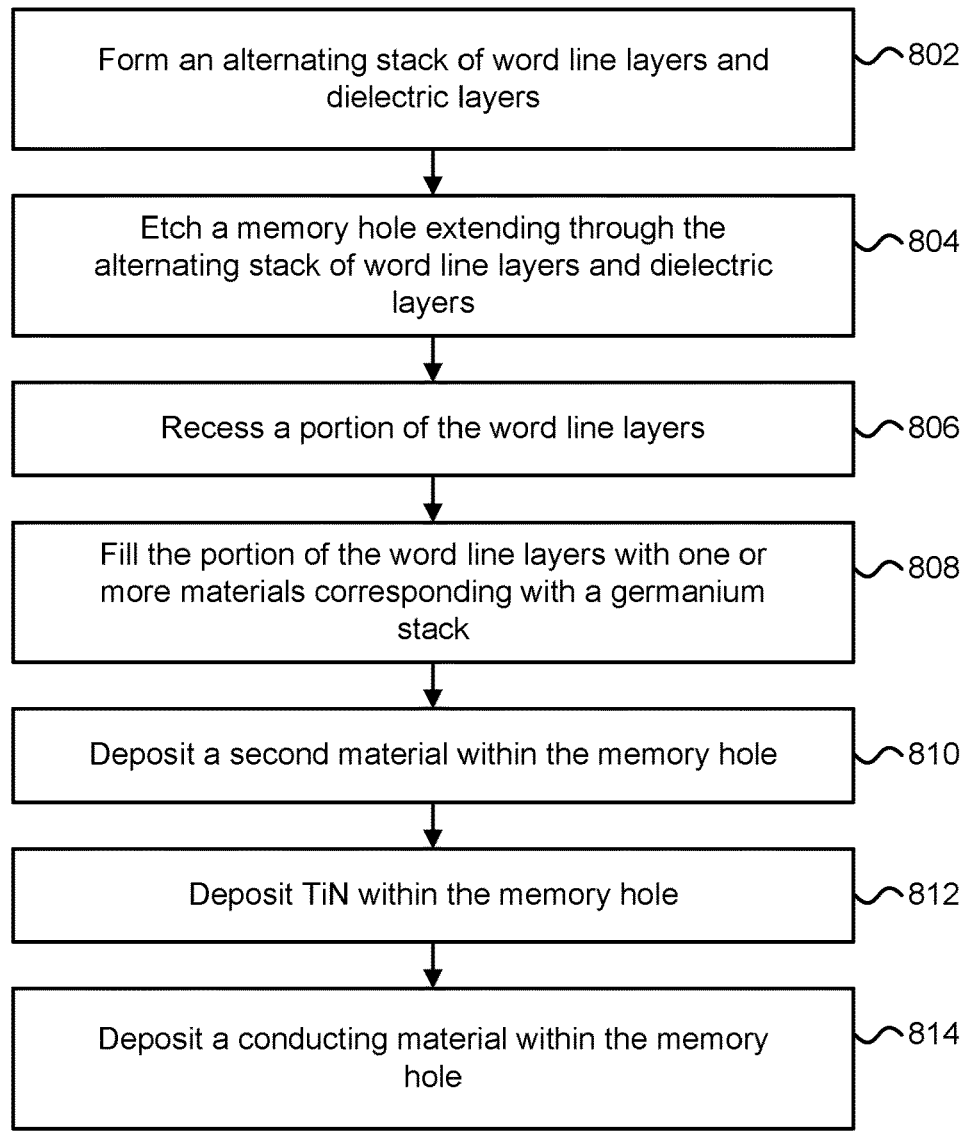
FIG. 8 depicts a flowchart describing an embodiment of a process for forming portions of a memory array.

FIG. 8 depicts a flowchart describing an embodiment of a process for forming portions of a memory array. The flowchart may omit common processing steps (e.g., the formation of isolation regions or structures, various implant and annealing steps, the formation of vias/contacts, the formation of a passivation layer, planarization, etc.) in order to highlight the processing steps described.

FIGS. 7A-7D depict various embodiments of processes for forming portions of a memory array. FIGS. 7A-7D may depict various stages of fabrication using cross-sectional views and may be referred to when describing the process of FIG. 8.

Referring to FIG. 8, in step 802, an alternating stack of word line layers and dielectric layers are formed. The alternating stack of word line layers and dielectric layers may comprise an alternating stack of TiN or polysilicon that are separated by layers of oxide or silicon dioxide. The alternating stack of word line layers and dielectric layers may be formed over one or more global bit lines or above a global bit line layer. The layers may be formed over an n+ polysilicon layer, such as n+ polysilicon layer 524 in FIG. 6A or positioned above a substrate, such as a silicon substrate or glass substrate. The alternating stack of word line layers and dielectric layers may be deposited using various deposition techniques such as chemical vapor deposition (CVD), physical vapor deposition (PVD), or atomic layer deposition (ALD). In step 804, a memory hole is etched extending through the alternating stack of word line layers and dielectric layers. The memory hole may be etched using various etching techniques such as dry etching, wet chemical etching, plasma etching, or reactive-ion etching (RIE).

Figure 7A:
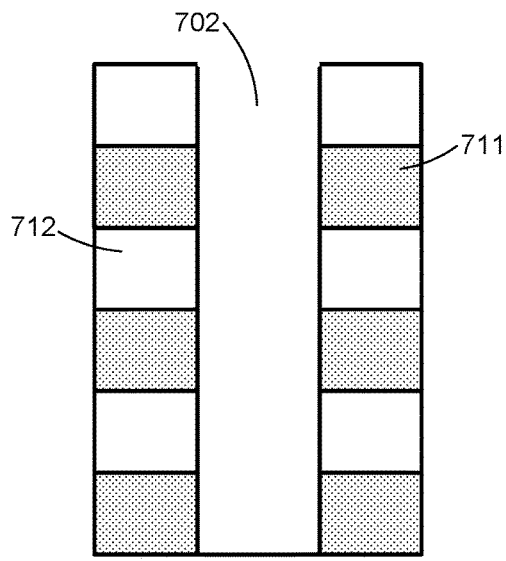
FIGS. 7A-7D depict various embodiments of processes for forming portions of a memory array.

Referring to FIG. 7A, an alternating stack of word line layers and dielectric layers have been formed and a memory hole 702 has been etched extending through the alternating stack of word line layers and dielectric layers. The word line layers include word line layer 712, which may comprise a layer of TiN, polysilicon, titanium, tantalum, or tungsten (W). The dielectric layers include dielectric layer 711, which may comprise a layer of silicon dioxide.

Figure 7B:
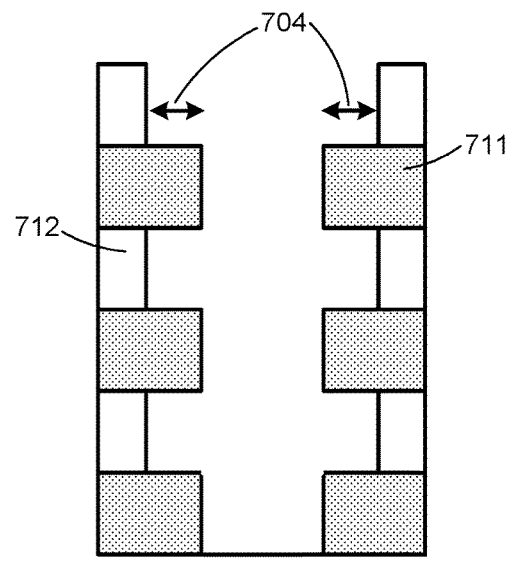
Figure 7C:
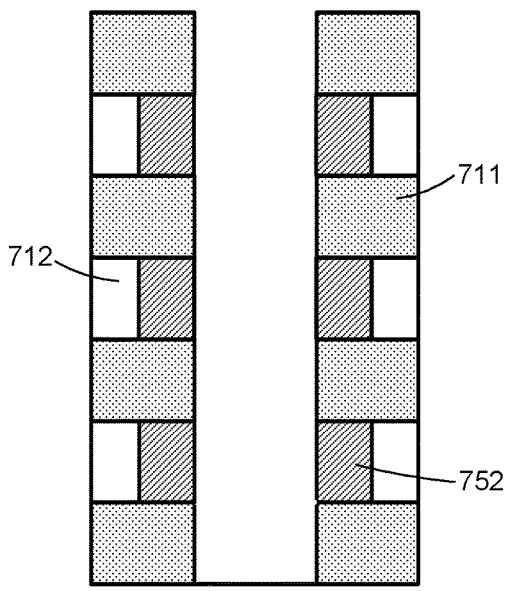
Figure 7D:
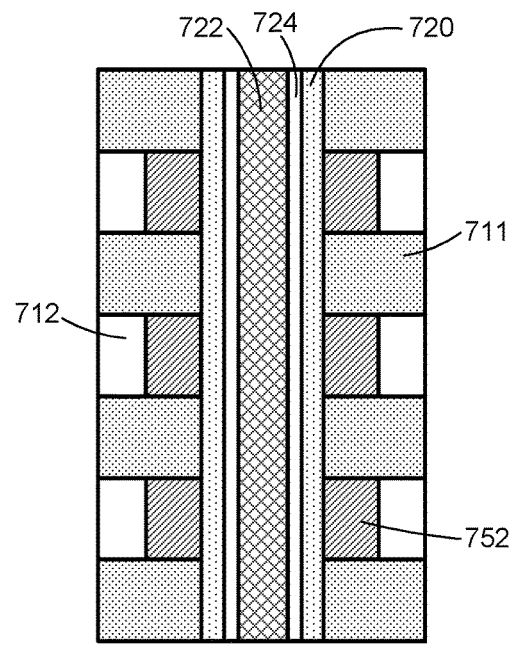

Referring to FIG. 8, in step 806, a portion of the word line layers is recessed. The word line layers may be recessed using a selective etch or a timed etch. Referring to FIG. 7B, a portion 704 of the word line layers has been recessed or removed. In step 808, the portion of the word line layers that was recessed is filled with one or more materials comprising a germanium stack. Referring to FIG. 7C, the portion of the word line layers has been filled with materials corresponding with a germanium stack 752. The germanium stack 752 may comprise one of the germanium stacks depicted in FIGS. 6F-6I. In step 810, a second material (e.g., titanium oxide) is deposited within the memory hole. The second material may correspond with a barrier layer of a BMC structure. In step 812, titanium nitride or tungsten nitride may be deposited within the memory hole. In some cases, the layer of titanium nitride or tungsten nitride may be omitted. In step 814, a conducting material (e.g., tungsten) is deposited within the memory hole. Referring to FIG. 7D, a second material 720 has been deposited within the memory hole, along with a layer of titanium nitride 724 and a layer of conducting material 722 (e.g., tungsten). The conducting material 722 within the memory hole may correspond with a vertical bit line. In some cases, the arrangement of the germanium stack 752 and the second material 720 may be swapped with each other.

In one embodiment, a layer of titanium oxide may be partially embedded within a recessed region of a word line layer while a germanium stack is formed within a memory hole and is not formed within the recessed region of the word line layer. In this case, the word line layers within the alternating stack of word line layers and dielectric layers may be formed using titanium metal. A thin layer of titanium nitride may be used on the top and/or bottom of each layer of titanium metal in order to prevent excess oxidation of titanium by dielectric layers comprising silicon dioxide. In another embodiment, a layer of titanium oxide and the entire germanium stack may be fully embedded within a recessed region of the word line layer. In this case, both the layer of titanium oxide and the layers of germanium stack may be totally formed within the recessed region and may not extend outside of the recessed region. In some cases, the word line layers may comprise titanium metal and the word line layers may be recessed with a mixed acid wet etch process.

In some cases, a word line layer may comprise a particular metal (e.g., titanium, tantalum, or tungsten) and a portion of the BMC structure or the memory cell structure may be formed via oxidation of the word line layer (e.g., after etching of a memory hole or after recessing a portion of the word line layer). The portion of the BMC structure or the memory cell structure may comprise a metal oxide. In one example, the word line layer may comprise titanium and the portion of the memory cell structure may comprise titanium oxide. In another example, the word line layer may comprise tungsten and the portion of the memory cell structure may comprise tungsten oxide. In another example, the word line layer may comprise tantalum and the portion of the memory cell structure may comprise tantalum oxide.

One embodiment of the disclosed technology a bit line, a word line, and a memory cell arranged between the word line and the bit line. The memory cell includes a first conductive metal oxide in series with an alternating stack of one or more layers of germanium with one or more layers of a second conductive metal oxide different from the first conductive metal oxide.

One embodiment of the disclosed technology includes one or more control circuits and a memory array including a word line and a bit line. The memory array includes a memory cell arranged between the word line and the bit line. The memory cell comprises a first conductive metal oxide of a first metal adjacent to a layer of a germanium-metal alloy of a second metal adjacent to a first layer of the second metal. The second metal is different from the first metal. The one or more control circuits configured to bias the word line and the bit line during a memory operation.

One embodiment of the disclosed includes forming an alternating stack of word line layers and dielectric layers, etching a memory hole extending through the alternating stack of word line layers and dielectric layers, recessing a portion of a first word line layer of the word line layers subsequent to etching the memory hole, depositing one of a layer of amorphous germanium or a layer of amorphous silicon germanium within a first region of the recessed portion of the first word line layer, depositing a layer of a second metal oxide within a second region of the recessed portion of the first word line layer, and depositing a layer of a first metal oxide different from the second metal oxide within the memory hole.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A memory structure, comprising:
a bit line;
a word line; and
a memory cell arranged between the word line and the bit line, the memory cell includes a first conductive metal oxide in series with an alternating stack of one or more layers of germanium with one or more layers of a second conductive metal oxide different from the first conductive metal oxide, the first conductive metal oxide comprises titanium oxide and the second conductive metal oxide comprises aluminum oxide, a second metal of the second conductive metal oxide has a greater affinity for oxygen compared with a first metal of the first conductive metal oxide.

2. The memory structure of claim 1, wherein:
the alternating stack of the one or more layers of germanium with the one or more layers of the second conductive metal oxide comprises a first layer of germanium adjacent to a first layer of the second conductive metal oxide.

3. The memory structure of claim 2, wherein:
the word line directly connects to the second conductive metal oxide; and
the bit line connects to the first conductive metal oxide.

4. The memory structure of claim 2, wherein:
the alternating stack of the one or more layers of germanium with the one or more layers of the second conductive metal oxide comprises the first layer of germanium adjacent to the first layer of the second conductive metal oxide and a second layer of germanium adjacent to the first layer of the second conductive metal oxide.

5. The memory structure of claim 4, wherein:
the word line directly connects to the second layer of germanium; and
the bit line connects to the first conductive metal oxide.

6. The memory structure of claim 2, wherein:
a thickness of the first layer of germanium is greater than a thickness of the first layer of the second conductive metal oxide.

7. The memory structure of claim 2, wherein:
the alternating stack of the one or more layers of germanium with the one or more layers of the second conductive metal oxide comprises the first layer of germanium adjacent to the first layer of the second conductive metal oxide, a second layer of germanium adjacent to the first layer of the second conductive metal oxide, and a second layer of the second conductive metal oxide adjacent to the second layer of germanium.

8. The memory structure of claim 1, further comprising:
a second memory cell arranged between a second word line and the bit line, the second word line is arranged above the word line, the second memory cell includes a third conductive metal oxide in series with an alternating stack of one or more layers of germanium with one or more layers of a fourth conductive metal oxide different from the third conductive metal oxide.

9. The memory structure of claim 1, wherein:
the memory cell comprises a multi-level memory cell; and
the bit line comprises a vertical bit line arranged orthogonal to a surface of a substrate.

10. An apparatus, comprising:
a memory array including a word line and a bit line, the memory array includes a memory cell arranged between the word line and the bit line, the memory cell comprises a first conductive metal oxide of a first metal adjacent to a layer of a germanium-metal alloy of a second metal adjacent to a first layer of the second metal, the second metal is different from the first metal, the first metal comprises titanium and the second metal comprises aluminum, the second metal has a greater affinity for oxygen compared with the first metal; and
one or more control circuits configured to bias the word line and the bit line during a memory operation.

11. The apparatus of claim 10, wherein:

the memory operation comprises a read operation;

the first conductive metal oxide comprises titanium dioxide; and the layer of the germanium-metal alloy of the second metal is arranged between the first conductive metal oxide of the first metal and the first layer of the second metal.

12. The apparatus of claim 10, wherein:

the memory cell comprises a multi-level memory cell; and the bit line comprises a vertical bit line arranged orthogonal to a surface of a substrate.

* * * * *